(12) United States Patent
Guo et al.

(10) Patent No.: US 11,656,276 B2
(45) Date of Patent: May 23, 2023

(54) MONITORING CIRCUIT AND METHOD FOR FUNCTION MONITORING

(71) Applicant: Varroc Lighting Systems, s.r.o., Šenov u Noveho Jicina (CZ)

(72) Inventors: Hongxin Guo, Elsdorf (DE); Ashvanth Suresh, Cologne (DE)

(73) Assignee: VARROC LIGHTING SYSTEMS, S.R.O., Senov u Noveho Jicina (CZ)

( * ) Notice: Subject to any disclaimer, the term of this patent is extended or adjusted under 35 U.S.C. 154(b) by 117 days.

(21) Appl. No.: 17/212,238

(22) Filed: Mar. 25, 2021

(65) Prior Publication Data

US 2021/0302497 A1 Sep. 30, 2021

(30) Foreign Application Priority Data

Mar. 26, 2020 (DE) ..................... 10 2020 108 341.6

(51) Int. Cl.
*G01R 31/317* (2006.01)
*G01R 31/3177* (2006.01)
*H03H 7/06* (2006.01)
*H03K 19/21* (2006.01)

(52) U.S. Cl.
CPC ... *G01R 31/31713* (2013.01); *G01R 31/3177* (2013.01); *H03H 7/06* (2013.01); *H03K 19/21* (2013.01)

(58) Field of Classification Search
None
See application file for complete search history.

(56) References Cited

U.S. PATENT DOCUMENTS 5,081,625 A 1/1992 Rhee et al.

FOREIGN PATENT DOCUMENTS

| DE | 33 22 242 A1 | 1/1984 | |
|---|---|---|---|
| DE | 32 40 707 A1 | 5/1984 | |
| DE | 37 14 630 A1 | 11/1988 | |
| EP | 1331742 * | 1/2003 | ............. H03L 7/099 |

(Continued)

OTHER PUBLICATIONS

Forum: micro controller and digital electronic: minimal analogous 'watchdog', Mar. 2013, URL: https://www.mikrocontroller.net/topic/291446 [accessed on Nov. 10, 2020].

*Primary Examiner* — Guerrier Merant
(74) *Attorney, Agent, or Firm* — Ursula B. Day

(57) ABSTRACT

A monitoring circuit and a method for function monitoring is disclosed where the device includes the input being connected with a first subassembly that detects a frequency range of the status signal, with the first subassembly being connected with a second subassembly to implement a logical signal combination. The second subassembly is connected with a third subassembly generating a delayed output signal. The method compares a frequency fsw of the status signal with a lower first cutoff frequency f1 and an upper second cutoff frequency f2. When the frequency fsw of the status signal is located within the predetermined frequency range, the functional reliability signal is provided with a first voltage level, and when the frequency fsw of the status signal is located outside of the predetermined frequency range, the functional reliability signal is provided with a second voltage level that is different from the first voltage level.

11 Claims, 4 Drawing Sheets

(56) References Cited

FOREIGN PATENT DOCUMENTS

| WO | WO-2007062714 A1 | * | 6/2007 | ............ G01F 23/265 |
| WO | WO-2011047699 A1 | * | 4/2011 | ............. G01R 29/26 |
| WO | WO-2011138122 A2 | * | 11/2011 | ......... A47L 15/0049 |

* cited by examiner

MONITORING CIRCUIT AND METHOD FOR FUNCTION MONITORING

CROSS-REFERENCES TO RELATED APPLICATIONS

This application claims the priority of German Patent Application Serial No. 10 2020 108 341.6, filed Mar. 26, 2020, pursuant to 35 U.S.C. 119(a)-(d), the subject matter of which is incorporated herein by reference.

BACKGROUND OF THE INVENTION

The invention relates to a monitoring circuit for monitoring a proper function of a digital circuit or a microprocessor, which has an input for a status signal (SW), by means of which the monitoring of the proper function is performed, and an output to output a reliability signal (Fusa).

The invention also relates to a method for monitoring a proper function of a digital circuit or a microprocessor, in which a square-wave status signal (SW) is checked for a presence or a temporal arrival and, in dependence on this check, a reliability signal (Fusa) is generated as output signal.

Known are monitoring circuits, which are employed, for example, in digital circuits or systems for monitoring a proper function of the digital circuit or a microprocessor.

In addition to the term monitoring circuit, the term watchdog or watchdog circuit is also used. A skilled person usually understands this to be an arrangement or a method for detecting a fault or a failure in a digital circuit, which are used for example for control applications in appliances, vehicles or equipment.

When a monitoring circuit detects such a malfunction, for example, a control instruction may be generated to continue a program sequence by means of a corresponding fault routine, wherein such fault routine can recognize and eliminate the cause of the fault or malfunction. Alternatively, the digital circuit or the microprocessor may be restarted. Also, alternatively, one can switch to a second or redundant system to continue the proper function. As another possibility, the digital circuit or the microprocessor may be shut down and the operation can be terminated.

Such monitoring circuits for detecting malfunctions or faults are usually employed in microprocessors-controlled electrical devices, machines or vehicles in order to prevent a failure caused, for example, by a malfunction of software and to ensure a safe operation of the electrical device, the machine or the vehicle. Such a monitoring circuit for detecting a malfunction is necessary, in particular, in vehicles because a vehicle cannot abruptly be stopped in the event of a malfunction so as to prevent a hazard for other road users.

In monitoring circuits for detecting malfunctions, it may be checked, for example, at specified times, whether the digital circuit or the microprocessor operates properly. For this purpose, it is common practice to monitor corresponding signals such as status signals from a microprocessor or signals on a bus system of a microprocessor. Usually, such monitoring circuits are implemented as a separate module and are not provided as part of the microprocessor, in order to safely recognize its failure or malfunction during its operation.

During a start or a restart of a digital circuit or a microprocessor, the detection of a malfunction by the monitoring circuit is interrupted and the detection restarted only after the digital circuit or the microprocessor has again achieved its proper functional phase.

Known in the art are also so-called window-monitoring circuits for detecting of malfunctions, whereby the digital circuit or the microprocessor generates a predefined signal within a predetermined time window or time interval and transmits the same for examination to the window monitoring circuit.

When the predefined signals are received from the window monitoring circuit within the predefined time window, the window-monitoring circuit recognizes a proper function. When the predefined signals are received from the window monitoring circuit outside the predefined time window or are not received at all, the window monitoring circuit detects a faulty operation or a malfunction, with the window-monitoring circuit in response producing, for example, a reset signal for the digital circuit or the microprocessor, in order to ensure again a proper function after the system has been reset. Alternatively, only a signal indicating the faulty mode of operation or the malfunction may be generated.

Alternatively, the times between the received predefined signals may be measured. When the currently measured time exceeds a predetermined threshold, for example, a reset signal is generated for the digital circuit or the microprocessor. For example, such a reset signal may be generated so that a digital signal switches from a high level to a low level and again returns to its high level, wherein the low level is maintained for a predetermined duration. Such signal pulse can be used as a reset signal for a digital circuit or directly for a microprocessor.

In a further embodiment of a window monitoring circuit, it is known to generate a reset signal even when the currently measured time falls below a predetermined threshold.

In a simple realization of a monitoring circuit, a timer arrangement can be provided, which changes after a predetermined time period that is determined, for example, by a resistor-capacitor element (RC-element) a signal state, for example, of a signal at an output of the monitoring circuit. In response to the proper receipt of the predefined signals, this timing arrangement of the monitoring circuit is always reset and hence does not change the signal state at the output. If the predefined signals are not properly received, the time period elapses and the signal state at the output is changed. This change of the signal state causes, for example, a reset signal (Reset) for the digital circuit or the microprocessor to be generated.

For example, such monitoring circuits are employed in vehicles in applications relevant for the functional safety such as high beam, low beam, direction indicator, brake light and rear light in the field of the vehicle lighting system. In this case, for example, a control device which includes a microprocessor is monitored. In particular in the field of automotive engineering, faults or malfunctions must be recognized in a timely fashion and when a fault or a malfunction occurs, appropriate measures, such as a shut-down of assemblies, switching over to redundant systems or a restart must be initiated.

Known are, for example, monitoring circuits as complete integrated circuits or circuits (IC) with the names TPS7B6350QPWPRQ1 from the company Texas Instruments or NCV8518B from the US semiconductor manufacturer ON Semiconductor.

Such circuits are known as precise voltage regulators for microprocessors, which are used in particular in the automobile industry. The circuit has an integrated so-called "watchdog timer" and provides adjustable functions for resetting, waking-up and activating the connected microprocessors or assemblies.

U.S. Pat. No. 5,081,625 discloses a monitoring circuit (watchdog circuit) that cooperates with a microprocessor. In particular, a monitoring circuit is disclosed that supplies to a microprocessor a reset signal to restore its performance and in the event of a program block.

The problem to be solved includes an improved circuit which is not only able to implement an initial reset when switching on an associated microprocessor, but is also able to provide suitable program reset signals to an associated microprocessor with a watchdog timing circuit.

SUMMARY OF THE INVENTION

To solve this problem, a watchdog timing circuit according to the present invention is connected with an associated microprocessor, to receive and to monitor a status signal outputted by the microprocessor. This status signal represents a series of pulses with a known operating cycle and a frequency that corresponds to the frequency with which program instructions are executed within the microprocessor. The circuit further includes a single astable multivibrator circuit with a single pair of complementary transistors.

It is a significant disadvantage of the known prior art that a monitoring circuit requires a timing circuit for generating a clock signal and/or for determining time intervals. Such arrangements are costly to implement or are provided by an additional integrated circuit or a circuit. In any case, disadvantages arise due to the necessary timing circuit arrangements, such as an increased space requirement, additional component costs and measures, such as for example shielding, for preventing interference between the timing circuit arrangement and adjacent assemblies.

Thus, there is a need for an improvement of the known conventional technology, and for an improved monitoring circuit, and an improved method for function monitoring.

According to one of the aspects of the present invention is to provide a monitoring circuit and a method for function monitoring which enables safe monitoring of the function of a digital circuit, or a microprocessor, wherein the complexity for a monitoring circuit and the cost of the monitoring circuitry are reduced. Such a monitoring circuit for monitoring proper function of a digital circuit includes a first subassembly having a first input receiving from the digital circuit a status signal having a frequency within a predetermined frequency range, a second subassembly connected to the first subassembly and implementing a logical signal combination, and a third subassembly connected with the second subassembly and having a first output generating in response to the received status signal a delayed output signal representing a functional reliability signal indicating the proper function of the digital circuit.

Other aspects of the present invention are embodied in a device having the features recited in the dependent claims.

Other aspects of the present invention refer to a method for monitoring proper function of a digital circuit, that includes receiving a square-wave status signal from the microprocessor, comparing a frequency of the received square-wave status signal with a lower first cutoff frequency and an upper second cutoff frequency, which form limits for a predetermined frequency range, and generating as an output signal a functional reliability signal indicating the proper function of the digital circuit, wherein when a frequency of the square-wave status signal is located within the predetermined frequency range, the functional reliability signal has a first voltage level, and when the frequency of the square-wave status signal is located outside the predetermined frequency range, the functional reliability signal has a second voltage level that is different from the first voltage level.

In the present invention, a discrete hardware circuit is provided which is capable of resetting a digital circuit or a microprocessor with a suitable reset signal generated by the hardware circuit.

For generating such a signal, is it provided to detect a square-wave signal received by the digital circuit or by the microprocessor, which is a status signal (SW) suitable for function monitoring, such that its low-high flanks and/or its high-low flanks are detected and therefrom a frequency fsw of the received square-wave signal can be derived.

It is further provided that the detection of faults or malfunctions by way of the inventive monitoring circuit for monitoring the function of a digital circuit or of a microprocessor does not necessitate a timing circuit arrangement for proper function.

According to the present invention, the digital circuit or the microprocessor can be reset and a functional reliability signal (Fusa) can be held at a low voltage level that corresponds to a low-signal, in the event that the flanks of the monitored square-wave status signal (SW) arrive at the monitoring circuit too quickly or too slowly. In this case, the frequency fsw of the status signal (SW) would be too high or too low.

Such status signal (SW) or a square-wave signal suitable, for example, for monitoring the function of a microprocessor can be generated, for example, by a microprocessor to be monitored by, on the one hand, triggering a rising edge of the status signal (SW) in response to an interrupt. Such interrupts can be generated during execution of a chain of commands by a control unit or by a scheduling unit or scheduler. A falling edge of the status signal (SW) can be generated, for example, in a time-controlled manner. In one embodiment, for example, units of time can be used for processing a series of jobs within a so-called task of a scheduler. In one example, such unit of time or a task may have a duration of 1 ms.

If the monitored flanks of the status signal (SW), and hence its frequency fsw, arrive within a predetermined tolerance, then a proper function of the digital circuit or the microprocessor is detected and the functional reliability signal (Fusa) is generated with a high voltage level, corresponding to a high-signal.

If the monitored flanks of the status signal (SW) or its frequency fsw are outside the predetermined tolerance, then a malfunction of the digital circuit or the microprocessor is detected. In this case, the reliability signal (Fusa) is generated with a low voltage level, corresponding to a low-signal. A low-signal produced in this manner can be used as a reset signal either directly or after an adjustment of the signal or the signal level.

If the monitoring circuit detects the transition of the digital circuit or of the microprocessor to a proper function after the functional reliability signal (Fusa) with a low voltage level has been generated, then the functional reliability signal (Fusa) is switched from its low voltage level in its high voltage level.

BRIEF DESCRIPTION OF THE DRAWING

Further details, features and advantages of embodiments of the invention will become evident from the following description of embodiments with reference to the accompanying drawings, which show in.

DETAILED DESCRIPTION OF PREFERRED EMBODIMENTS

Figure 1:
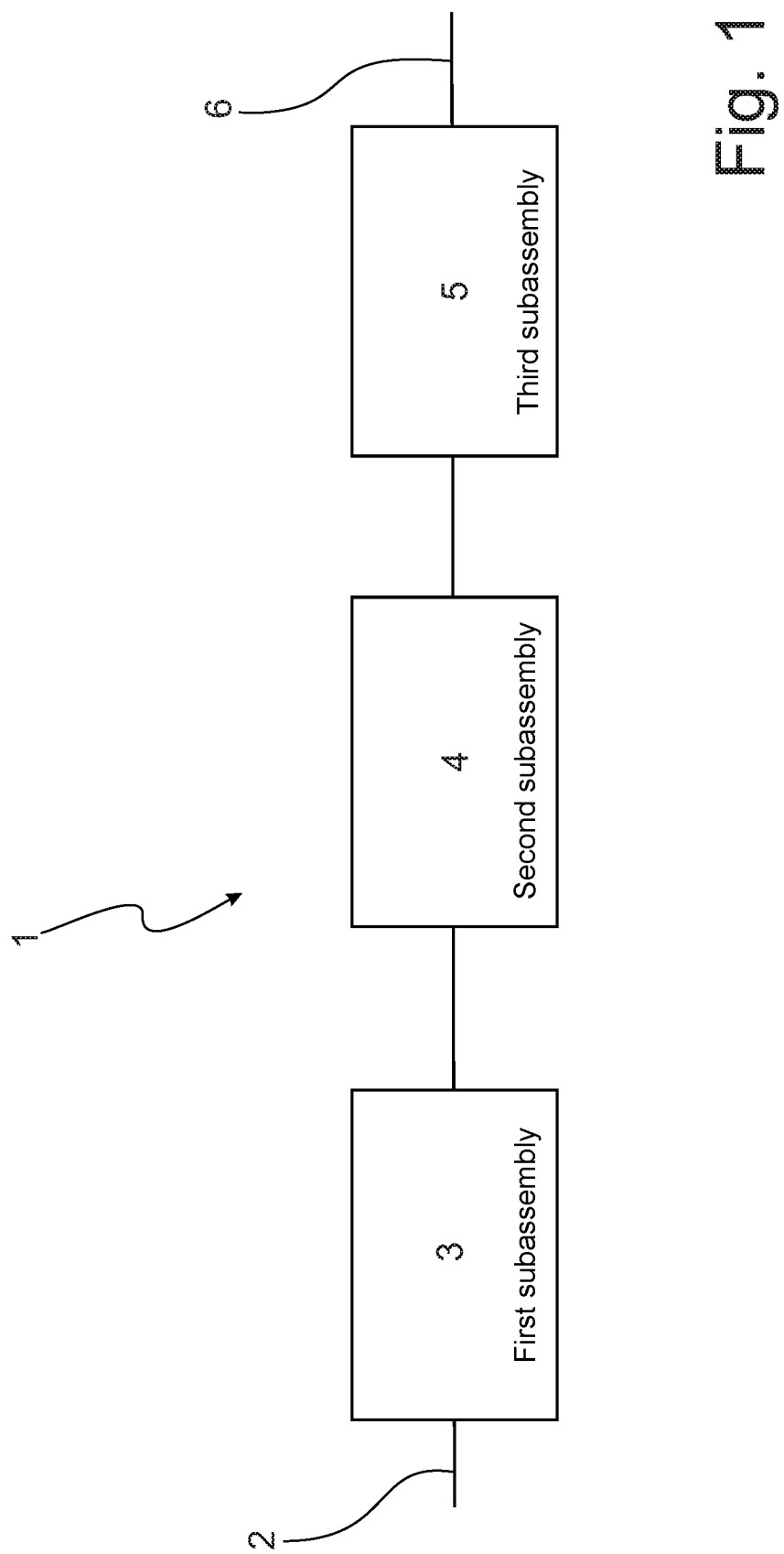
FIG. 1: a schematic diagram of a monitoring circuit according to the invention.

Throughout all the Figures, same or corresponding elements are generally indicated by same reference numerals.

FIG. 1 shows a schematic diagram of a monitoring circuit 1 according to the invention. A status signal (SW) 2a suitable for monitoring the function of a digital circuit or a microprocessor is applied at the input 2 of the first subassembly 3. The digital circuit or the microprocessor are not shown in FIG. 1.

A status signal 2a of this type is characterized by a series of pulses having a frequency fsw and being generated, for example, by the operation of a command execution of a microprocessor. In general, such signal may also be referred to as a square-wave signal with a frequency fsw.

It is provided that in the first subassembly 3, the frequency fsw of the status signal 2a is checked to determine whether the frequency fsw is located within a predetermined frequency range 11. This predetermined frequency range 11 represents the range, within which the digital circuit or the microprocessor operates properly and error-free.

For this purpose, a lower first cutoff frequency f1 and an upper second cutoff frequency f2 are set which form the boundaries of the predetermined frequency range 11, wherein the cutoff frequency f2 is greater than the cutoff frequency f1.

When the frequency fsw of the status signal 2a is greater than the first cutoff frequency f1, a first signal having, for example, a low-level is generated by the first subassembly 3 and outputted to the second subassembly 4, such that it changes from its low level to a high level.

Furthermore, when the frequency fsw of the status signal 2a is greater than the second cutoff frequency f2, a second signal having, for example, a low-level is generated by the first subassembly 3 and outputted to the second subassembly 4, such that it changes from its low level to a high level.

The terms high-level and low-level of a logic signal used in this description are merely exemplary. They can be suitably modified or inverted by a specialist without changing the actual function of the invention. The designations used for a high voltage level and a low voltage level indicate a high-level and a low-level of a logic signal, with their absolute voltage values varying according employed technology.

For example, in an alternative embodiment, the first subassembly 3 may provide a first signal with a high-level when the frequency fsw is smaller than the first cutoff frequency f1, and a signal with a low-level when the frequency fsw is greater than the first cutoff frequency f1.

For example, in an alternative embodiment, the first subassembly 3 may provide a second signal with a high-level when the frequency fsw is smaller than the second cutoff frequency f2, and a signal with a low-level when the frequency fsw is greater than the second cutoff frequency f2.

A logical check of the two signals produced by the first subassembly 3 is carried out in the second subassembly 4. For example, the two signals can be combined by a logical XOR-function. With an XOR operation, when the frequency fsw is located within the frequency range 11 predetermined by the cut-off frequency f1 and the cutoff frequency f2, the second subassembly 4 generates a signal in a first signal state, for example a high-level, which is then outputted to the third subassembly 5. Alternatively, when the frequency fsw is not located within the predetermined frequency range 11, the second subassembly 4 generates a signal in a second signal state, for example a low-level which is then outputted to the third subassembly 5.

The third subassembly 5 generates at its output 6 an output signal or the functional reliability signal Fusa 6a, which indicates the proper function of digital circuit to be monitored or of the microprocessor to be monitored.

Figure 2:
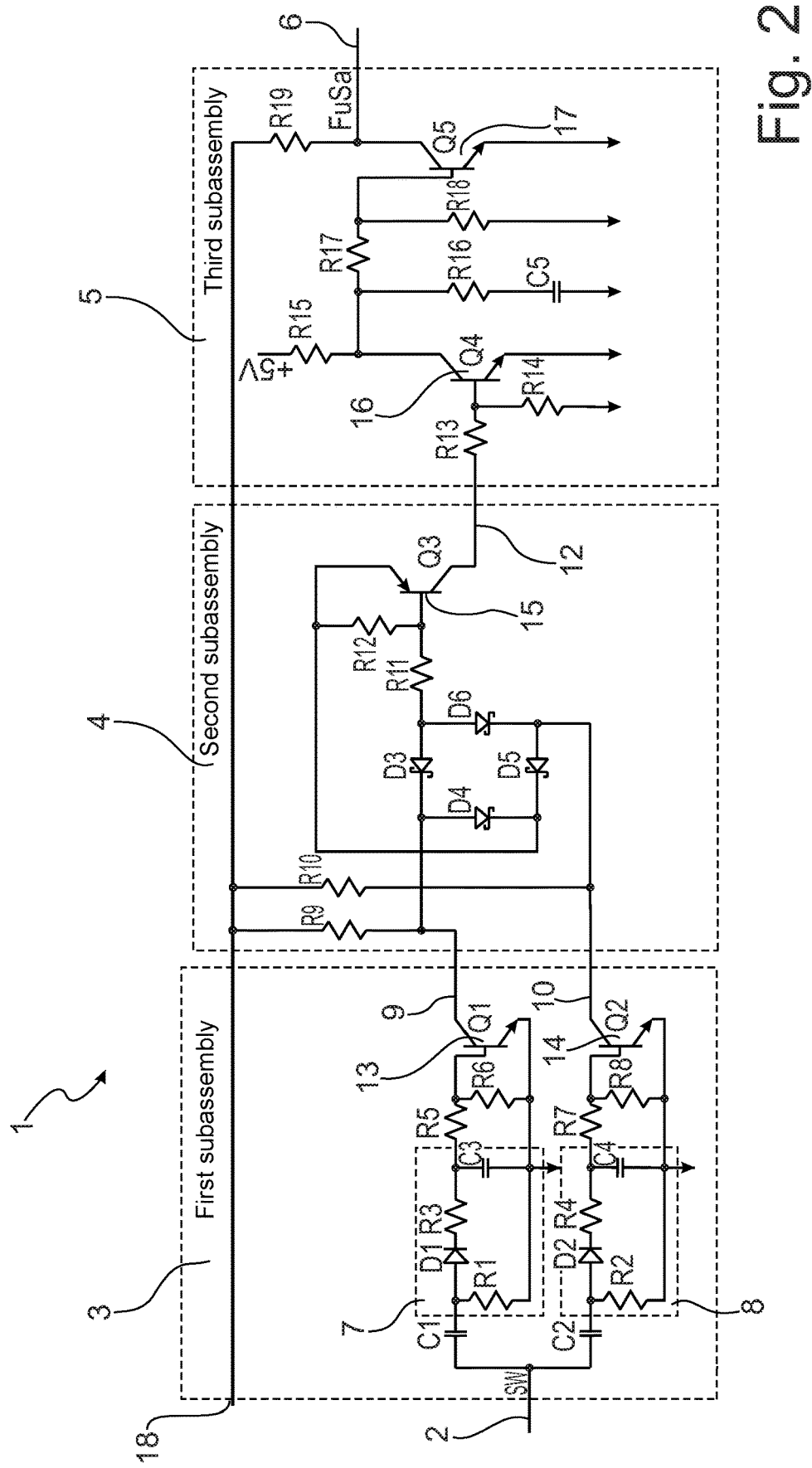
FIG. 2: an exemplary circuit implementation according to the invention.

FIG. 2 shows an exemplary circuit arrangement for a monitoring circuit 1.

For supplying power, the three subassemblies 3, 4, 5 are connected to an operating voltage 18.

In the first subassembly 3, a first high-pass filter 7 and a second high-pass filter 8 are shown which are each located downstream of respective input-side coupling capacitors C1 and C2 that are connected with the input 2. The high-pass filters 7 and 8 have different cutoff frequencies, wherein the cutoff frequency f2 of the second high-pass filter 8 is greater is than the cutoff frequency f1 of the first high-pass filter 7.

If the frequency fsw of the status signal 2a at the input 2, i.e. the square-wave signal, is higher than the cutoff frequency f1 of the first high-pass filter 7, then the first semiconductor switch 13 Q1 is turned on or rendered conducting. If this frequency condition is not met, then the first semiconductor switch 13 is turned off or disabled. The resistors R5 and R6 are provided for supplying a corresponding base voltage for the first semiconductor switch 13.

If the frequency fsw of the status signal 2a at the input 2, i.e. square-wave signal, is higher than the cutoff frequency f2 of the second high-pass filter 8, then the second semiconductor switch 14 Q 2 is turned on or rendered conducting. If this frequency condition is not met, then the second semiconductor switch 14 turned off or disabled. The resistors R7 and R8 are provided for supplying a corresponding base voltage for the second semiconductor switch 14.

Figure 3:
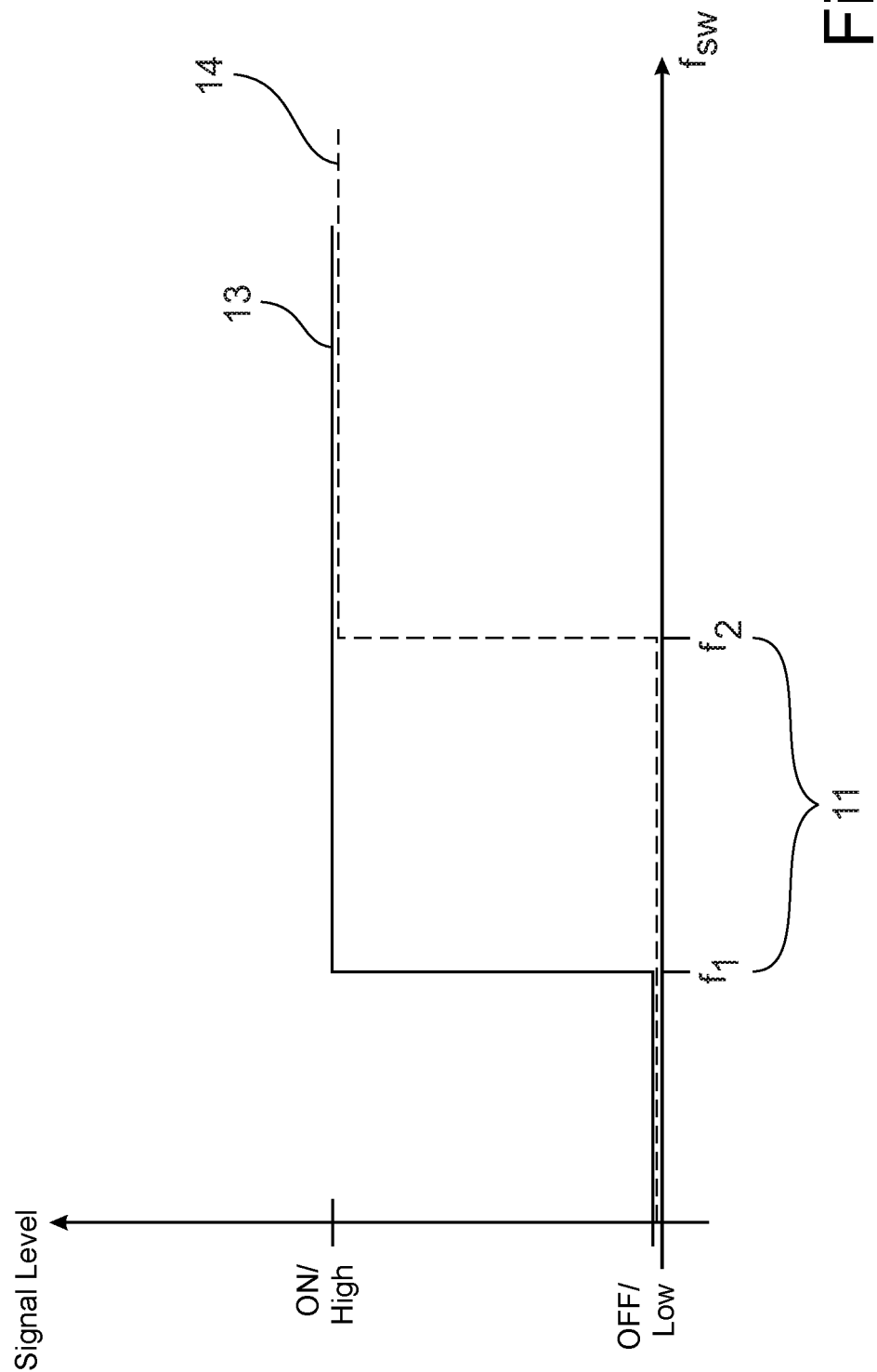
FIG. 3: switching states for the semiconductor switches Q1 and Q2 of the first subassembly.

This produces the switching states of the semiconductor switches 13 and 14 of the first subassembly 3 shown the FIG. 3. It is evident that with an increasing frequency fsw of the status signal 2a, first the semiconductor switch 13 turns on or becomes conducting at the cutoff frequency f1 and subsequently the semiconductor switch 14 turns on or becomes conducting when the cut-off frequency f2 is reached.

For the second output 9 and the third output 10 of the first subassembly 3, this represents in the illustrated exemplary circuit arrangement a logical inversion between the switching states shown in FIG. 3 and the signal levels present at the outputs 9 and 10. When the semiconductor switch 13 is turned on, this causes a low voltage level at the output 9, i.e. a logic low-level. When the semiconductor switch 13 is turned off, this causes a high voltage level at the output 9, i.e. a logical high-level.

Likewise, when the semiconductor switch 14 is turned on, this causes a low voltage level at output 10, i.e. a logical low-level. When the semiconductor switch 14 is turned off, this causes a high voltage level at the output 10, i.e. a logical high-level.

The second subassembly 4 is designed as an analog XOR circuit. This analog XOR circuit causes the third semiconductor switch 15 Q3 to become conductive or turn-on only when the outputs 9 and 10 and hence the semiconductor switches 13 and 14 have different switching states or signal levels.

These different switching states or signal levels at the outputs 9 and 10 are achieved only in the event that the frequency fsw of the status signal 2*a* is higher than the cutoff frequency f1 of the first high-pass filter 7 and lower than the cutoff frequency f2 of the second high-pass filter 8. This is shown in FIG. 3 by the range or frequency range 11. In this frequency range 11, the XOR condition is met and the third semiconductor switch 15 is switched on. The third semiconductor switch 15 is switched off outside this frequency range 11.

This means for the fourth output 12, that the output 12 has a high voltage level and thus a high level for the situation in the frequency range 11, wherein the following applies:

$$f_1 < f_{sw} < f_2$$

If this condition is satisfied within the frequency range 11, then the high-level at the fourth output 12 causes the fourth semiconductor switch 16 Q4 to be rendered conducting or turned on. Consequently, the fifth semiconductor switch 17 Q5 is turned off or blocked and a functional reliability signal 6*a* with a high signal level and hence a high-level is outputted at the output 6 of the third subassembly 5 or at the output 6 of the monitoring circuit 1. This high level of functional reliability signal 6*a* indicates proper function of the digital circuit or the microprocessor to be monitored.

In situations where $$f_1 < f_2 < f_{sw} \text{ or}$$

$$f_{sw} < f_1 < f_2$$

is applied, i.e. outside of the frequency range 11, the low level at the fourth output 12 causes the fourth semiconductor switch 16 to be turned off or blocked. Consequently, the fifth semiconductor switch 17 is turned on or rendered conducting, and a functional reliability signal 6*a* with a low signal level and thus a low-level is outputted at the output 6 of the control circuit 1. This low level of the functional reliability signal 6*a* indicates that a failure of the proper function of the digital circuit or the microprocessor to be monitored has occurred. To be on the safe side, the fifth semiconductor switch 17 is switched on with a time delay after a predetermined period of time has elapsed. As a result, short-term deviations of the frequency fsw of the status signal 2 do not immediately cause the signal at the output 6 to switch. Such time delay may be provided, for example, by means of a resistor-capacitor element, wherein the required time delay can be dimensioned by a skilled artisan as required. Such resistor-capacitor element is formed in the third subassembly 5 in FIG. 2 by the components R16 and C5.

The functional reliability signal 6*a* provided at the output 6 can, on the one hand, be displayed, thereby indicating a deviation from a normal operation or an occurrence of a fault. On the other hand, the functional reliability signal 6*a* switching from a high-level to a low-level can be used as a reset signal for the digital circuit or the microprocessor. Alternatively, the functional reliability signal 6*a* switching from a high-level to a low-level can suitably adapted so as to satisfy requirements of, for example, a reset input of a microprocessor. For example, a signal level of the functional reliability signal 6*a* may be adjusted or a corresponding time dependence of the functional reliability signal 6*a* may be processed when a reset signal has to be maintained for a predetermined period of time.

Figure 4:
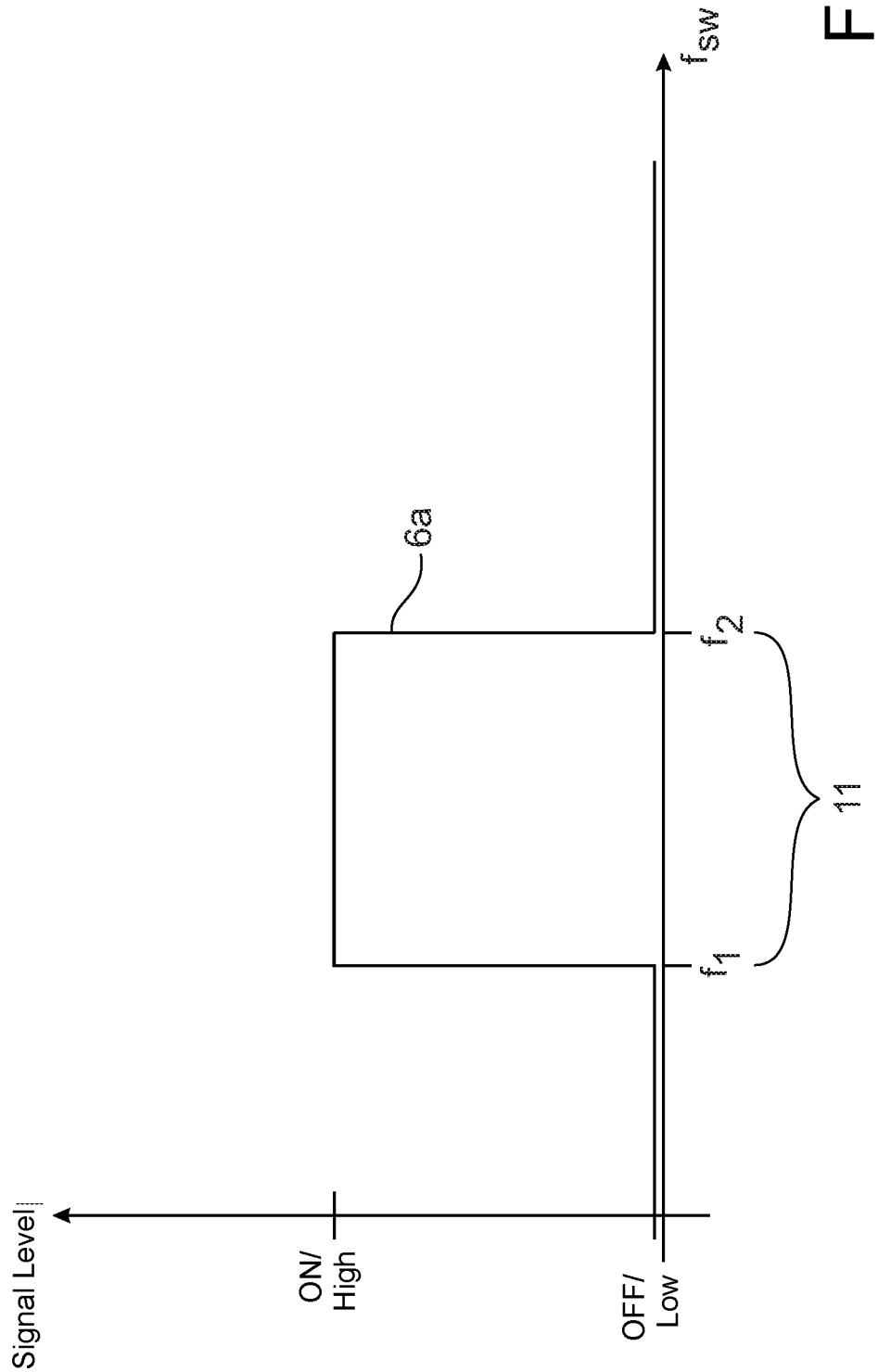
FIG. 4: the signal level of the functional reliability signal Fusa according to the invention on a frequency axis.

FIG. 4 shows the signal level of functional reliability signal 6*a* generated according to the invention on a frequency axis, with the frequency fsw of the status signal 2*a* being shown on the frequency axis. In the illustrated example, the functional reliability signal 6*a* is generated in the frequency range 11 with a high-level. Outside the frequency range 11, the functional reliability signal 6*a* has a low-level.

With the present invention, the functional reliability signal 6*a* is advantageously activated only when the digital circuit or the microprocessor to be monitored operates properly or operates again properly following a malfunction. In conventional devices, the level of a comparable functional reliability signal changes already following a reset of a microprocessor to be monitored, irrespective whether the microprocessor already operates properly or is, for example, still being initialized and hence does not yet operate properly.

Advantageously, the monitoring circuit and the method for function monitoring according to the invention operate without a clock or without a timing arrangement.

The invention enables monitoring of the status signal 2*a* within a predetermined frequency range (window frequency monitoring).

As a further advantage, the use of the inventive monitoring circuit for function monitoring lowers the costs compared to conventional circuits (watchdog—ICs).

In addition, the monitoring circuit according to the invention does not generate any interference signals affecting other assemblies, thus obviating the otherwise required filters.

The use of the monitoring circuit and of the method for function monitoring is contemplated, for example in vehicle construction, in particular in the field of the vehicle lighting systems (high beam, low beam, direction indicator, brake light and rear light).

While the invention has been illustrated and described as embodied in monitoring circuit and method for function monitoring, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

1. A monitoring circuit for monitoring proper function of a digital circuit, comprising:
   a first subassembly comprising a first input receiving from the digital circuit a status signal having a frequency within a predetermined frequency range, a first high-pass filter and a first semiconductor switch connected in series, and a second high-pass filter and a second semiconductor switch connected in series, with an input of the first high-pass filter and an input of the second high-pass filter each being capacitively connected to the first input,
   a second subassembly connected to the first subassembly and implementing a logical signal combination, and
   a third subassembly connected with the second subassembly and having a first output generating in response to the received status signal a delayed output signal representing a functional reliability signal indicating the proper function of the digital circuit.

2. The monitoring circuit of claim 1, wherein the second subassembly comprises
a logical XOR circuit having inputs receiving respective output signals outputted by the first and second semiconductor switches of the first subassembly, and an output of the logical XOR circuit being connected in series with a third semiconductor switch.

3. The monitoring circuit of claim 2, wherein the third subassembly comprises
a fourth semiconductor switch connected with an output of the third semiconductor switch, and a fifth semiconductor switch having an input receiving an input signal from an output of the fourth semiconductor switch and supplying at an output of the fifth semiconductor switch the functional reliability signal.

4. The monitoring circuit of claim 3, wherein the third subassembly comprises
a time delay device arranged between the output of the fourth semiconductor switch and the input of the fifth semiconductor switch, with the time delay device providing at the input of the fifth semiconductor switch a specified time delay for a turn-on signal or a turn-off-off signal generated by the fourth semiconductor switch.

5. The monitoring circuit of claim 1, wherein the digital circuit is a microprocessor.

6. A method for monitoring proper function of a digital circuit, comprising:
receiving a square-wave status signal from the microprocessor,
comparing a frequency of the received square-wave status signal with a lower first cutoff frequency and an upper second cutoff frequency, which form limits for a predetermined frequency range, and
generating as an output signal a functional reliability signal indicating the proper function of the digital circuit, wherein
when a frequency of the square-wave status signal is located within the predetermined frequency range, the functional reliability signal has a first voltage level, and when the frequency of the square-wave status signal is located outside the predetermined frequency range, the functional reliability signal has a second voltage level that is different from the first voltage level.

7. The method of claim 6, wherein the first voltage level is a high voltage level (high-level) and that the second voltage level is a low voltage level (low-level).

8. The method of claim 6, wherein comparing a frequency of the received square-wave status signal further comprises
filtering the received square-wave status signal with a first high-pass filter having the first cutoff frequency which generates a first signal with a low-level when the frequency of the square-wave status signal is below the first cutoff frequency, otherwise the first signal has a high-level, and
filtering the received square-wave status signal with a second high-pass filter having the second cutoff frequency which generates a second signal with a low-level when the frequency of the square-wave status signal ($2a$) is below the second cutoff frequency, otherwise the second signal has a high-level.

9. The method of claim 8, further comprising logically XOR-linking the first and second signals.

10. The method of claim 9, further comprising
inverting the logically XOR-linked first and second signals and adding a time delay, and
outputting the time-delayed signal as the functional reliability signal.

11. The method of claim 6, wherein the digital circuit is a microprocessor.

* * * * *